(12) United States Patent
Jeon et al.

(10) Patent No.: US 7,863,128 B1
(45) Date of Patent: Jan. 4, 2011

(54) NON-VOLATILE MEMORY DEVICE WITH IMPROVED ERASE SPEED

(75) Inventors: Joong Jeon, Cupertino, CA (US); Takashi Whitney Orimoto, Mountain View, CA (US); Robert B. Ogle, San Jose, CA (US); Harpreet Sachar, Milpitas, CA (US); Wei Zheng, Santa Clara, CA (US)

(73) Assignees: Spansion LLC, Sunnyvale, CA (US); GLOBALFOUNDRIES, Inc., Grand Cayman (KY)

( * ) Notice: Subject to any disclaimer, the term of this patent is extended or adjusted under 35 U.S.C. 154(b) by 174 days.

(21) Appl. No.: 11/049,855

(22) Filed: Feb. 4, 2005

(51) Int. Cl.
*H01L 21/8234* (2006.01)

(52) U.S. Cl. .................. 438/238; 438/239; 438/261; 438/387; 438/591; 257/E21.179

(58) Field of Classification Search .............. 438/238, 438/239, 261, 387, 591
See application file for complete search history.

(56) References Cited

U.S. PATENT DOCUMENTS

| | | | |
|---|---|---|---|
| 4,994,403 A | 2/1991 | Gill | |
| 5,688,724 A | 11/1997 | Yoon et al. | 438/778 |
| 5,914,895 A | 6/1999 | Jenne | 365/185.08 |
| 6,090,659 A | 7/2000 | Laibowitz et al. | 438/240 |
| 6,163,049 A | 12/2000 | Bui | 257/321 |
| 6,215,702 B1 | 4/2001 | Derhacobian et al. | |
| 6,407,435 B1 | 6/2002 | Ma et al. | |
| 6,445,030 B1 | 9/2002 | Wu et al. | 257/315 |
| 6,559,014 B1 | 5/2003 | Jeon | |
| 6,562,491 B1 | 5/2003 | Jeon | |
| 6,617,639 B1 | 9/2003 | Wang et al. | 257/324 |
| 6,642,573 B1 | 11/2003 | Halliyal et al. | |
| 6,674,138 B1 | 1/2004 | Halliyal et al. | |
| 6,693,004 B1 | 2/2004 | Halliyal et al. | |
| 6,744,675 B1 | 6/2004 | Zheng et al. | |
| 6,750,066 B1 | 6/2004 | Cheung et al. | |
| 6,753,570 B1 | 6/2004 | Tripsas et al. | |
| 6,760,270 B2 | 7/2004 | Chindalore et al. | |
| 6,768,160 B1 | 7/2004 | Li et al. | |
| 6,797,599 B2 | 9/2004 | Visokay et al. | |
| 6,812,517 B2 | 11/2004 | Baker | |
| 6,894,932 B1 | 5/2005 | Melik-Martirosian et al. | 365/185.28 |
| 6,902,969 B2 | 6/2005 | Adetutu et al. | |

(Continued)

FOREIGN PATENT DOCUMENTS

DE      29 46 864 A1     6/1980

OTHER PUBLICATIONS

Co-pending U.S. Appl. No. 11/008,233, filed Dec. 10, 2004; entitled: "Memory Cell Having Enhanced High-K Dielectric", by Joong Jeon et al., 30 pages.

(Continued)

*Primary Examiner*—Wai-Sing Louie
(74) *Attorney, Agent, or Firm*—Harrity & Harrity, LLP (57) ABSTRACT

A memory device may include a substrate, a first dielectric layer formed over the substrate and a charge storage element formed over the first dielectric layer. The memory device may also include a second dielectric layer formed over the charge storage element and a third dielectric layer formed over the second dielectric layer. The third dielectric layer may have a high dielectric constant and may be deposited at a relatively high temperature. A control gate may be formed over the third dielectric layer.

8 Claims, 7 Drawing Sheets

U.S. PATENT DOCUMENTS

| | | | |
|---|---|---|---|
| 6,939,767 B2 | 9/2005 | Hoefler et al. | |
| 7,005,695 B1 | 2/2006 | Agarwal | 257/310 |
| 7,012,299 B2 * | 3/2006 | Mahajani et al. | 257/324 |
| 7,034,356 B2 | 4/2006 | Nomoto et al. | |
| 7,038,284 B2 | 5/2006 | Haukka et al. | |
| 7,071,538 B1 | 7/2006 | Shiraiwa et al. | |
| 7,091,548 B2 | 8/2006 | Jeong et al. | |
| 7,138,680 B2 | 11/2006 | Li et al. | |
| 7,365,389 B1 | 4/2008 | Jeon et al. | |
| 2002/0024092 A1 | 2/2002 | Palm et al. | |
| 2002/0090808 A1 | 7/2002 | Jeon et al. | 438/622 |
| 2003/0045082 A1 * | 3/2003 | Eldridge et al. | 438/593 |
| 2003/0062567 A1 | 4/2003 | Zheng et al. | 257/316 |
| 2003/0122204 A1 | 7/2003 | Nomoto et al. | 257/406 |
| 2004/0028952 A1 | 2/2004 | Cartier et al. | 428/698 |
| 2004/0102002 A1 * | 5/2004 | Sandhu et al. | 438/240 |
| 2005/0006696 A1 | 1/2005 | Noguchi et al. | 257/316 |
| 2005/0036391 A1 | 2/2005 | Tomiie et al. | 365/232 |
| 2006/0003529 A1 | 1/2006 | Baker | 438/258 |
| 2006/0160303 A1 | 7/2006 | Ang et al. | |

OTHER PUBLICATIONS

Co-pending U.S. Appl. No. 11/128,392, filed May 13, 2005; entitled: "SONOS Memory Cell Having a Graded High-K Dielectric", by Takashi Whitney Orimoto et al., 31 pages.

Co-pending U.S. Appl. No. 11/086,310, filed Mar. 23, 2005; entitled: "High K Stack for Non-Volatile Memory", by Wei Zheng et al., 21 pages.

Co-pending U.S. Appl. No. 11/196,434, filed Aug. 4, 2005; entitled: "SONOS Memory Cell Having High-K Dielectric", by Takashi Whitney Orimoto et al., 27 pages.

* cited by examiner

NON-VOLATILE MEMORY DEVICE WITH IMPROVED ERASE SPEED

TECHNICAL FIELD

The present invention relates generally to semiconductor devices and methods of manufacturing semiconductor devices. The invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology.

One type of conventional electrically erasable programmable read only memory (EEPROM) device includes a silicon substrate with an oxide-nitride-oxide (ONO) stack formed on the substrate. A silicon control gate is formed over the ONO stack. This type of memory device is often referred to as a SONOS (silicon-oxide-nitride-oxide-silicon) type memory device. In a SONOS device, the nitride layer acts as the charge storage layer.

The SONOS type memory device may be programmed by a hot electron injection process that injects electrons into the nitride layer where they become trapped. The nitride layer may then store this negative charge.

The SONOS type memory device is typically erased using a hot hole injection (HHI) process. In the HHI process, voltages may be applied to the memory device to cause hot holes to move into the nitride layer, effectively erasing the negative charge on the nitride layer. Fowler-Nordheim (FN) erase mechanisms that are used in conventional floating gate memory devices (e.g., memory devices with polycrystalline floating gate electrodes) are not typically used in SONOS type memory devices due to back gate injection problems. That is, during the erase process, as electrons tunnel from the nitride layer into to the substrate, electrons also move from the control gate through the top oxide layer to the nitride layer. These electrons from the control gate effectively counter the loss of electrons tunneling through the bottom oxide layer. Therefore, FN erasing is not typically performed for a SONOS type memory device.

DISCLOSURE OF THE INVENTION

Implementations consistent with the invention provide a non-volatile memory device, such as an EEPROM, that includes a layer having a high dielectric constant (K) value (e.g., a K value greater than silicon dioxide) formed over the charge storage layer. The high K layer helps prevent back gate injection problems during an erase procedure. In addition, the high K layer may be deposited at a relatively high temperature that results in faster erase times for the memory device.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a first dielectric layer formed over the substrate and a charge storage element formed over the first dielectric layer. The memory device also includes a second dielectric layer formed over the charge storage element and a third dielectric layer formed over the second dielectric layer, where the third dielectric layer has a high dielectric constant. The memory device further includes a control gate formed over the third dielectric layer.

According to another aspect consistent with the invention, a method of manufacturing a semiconductor device is provided. The method includes forming a first dielectric over a substrate, forming a charge storage element over the first dielectric. The method also includes forming a second dielectric over the charge storage element and forming a third dielectric over the second dielectric, where the third dielectric has a high dielectric constant. The method further includes forming a control gate over the third dielectric.

According to a further aspect consistent with the invention, a non-volatile memory device is provided. The non-volatile memory device includes a substrate and a first dielectric formed over the substrate. The non-volatile memory device also includes a charge storage element formed over the first dielectric and a second dielectric formed over the charge storage element. The non-volatile memory device further includes an aluminum oxide layer formed over the second dielectric and a control gate formed over the aluminum oxide layer.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Figure 1A:
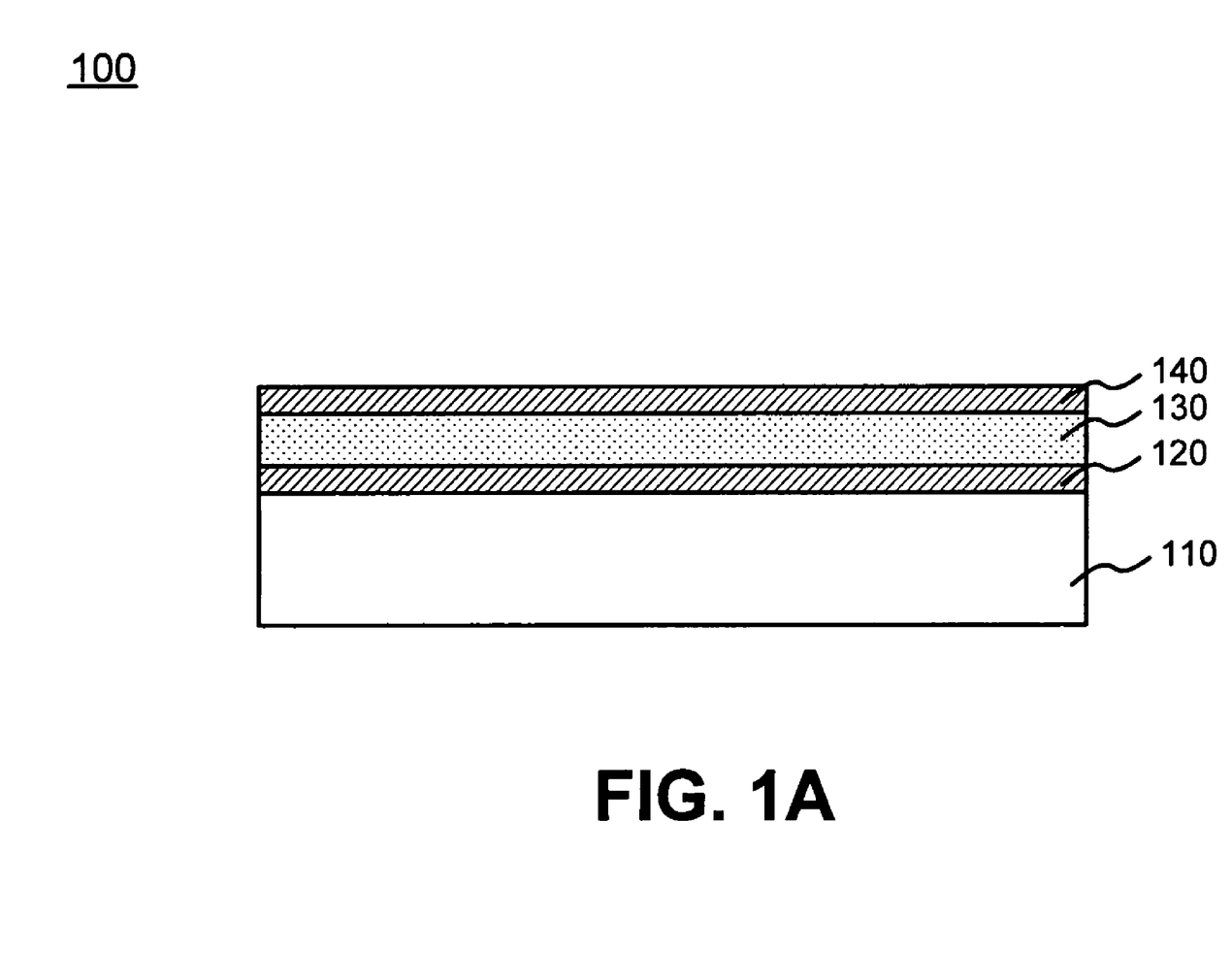
FIG. 1A is a cross-section illustrating exemplary layers used to form a charge storage structure in a semiconductor device in accordance with an embodiment of the invention.

FIG. 1A illustrates the cross-section of a semiconductor device 100 formed in accordance with an embodiment of the invention. Referring to FIG. 1A, semiconductor device 100 may include layers 110, 120, 130 and 140. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., SiO$_2$), and may have a thickness ranging from about 15 Å to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride). Layer 130, consistent with the invention, may act as a charge storage layer for semiconductor device 100 and may have a thickness ranging from about 20 Å to about 100 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., SiO$_2$). Alternatively, layer 140 may include another dielectric material, such as a silicon oxynitride, that may be deposited or thermally grown on layer 130. In still other alternatives, layer 140 may be a composite that includes a number of dielectric layers or films. Layer 140 may have a thickness ranging from about 15 Å to about 100 Å and may function as an inter-gate dielectric for memory cells in semiconductor device 100.

Figure 1B:
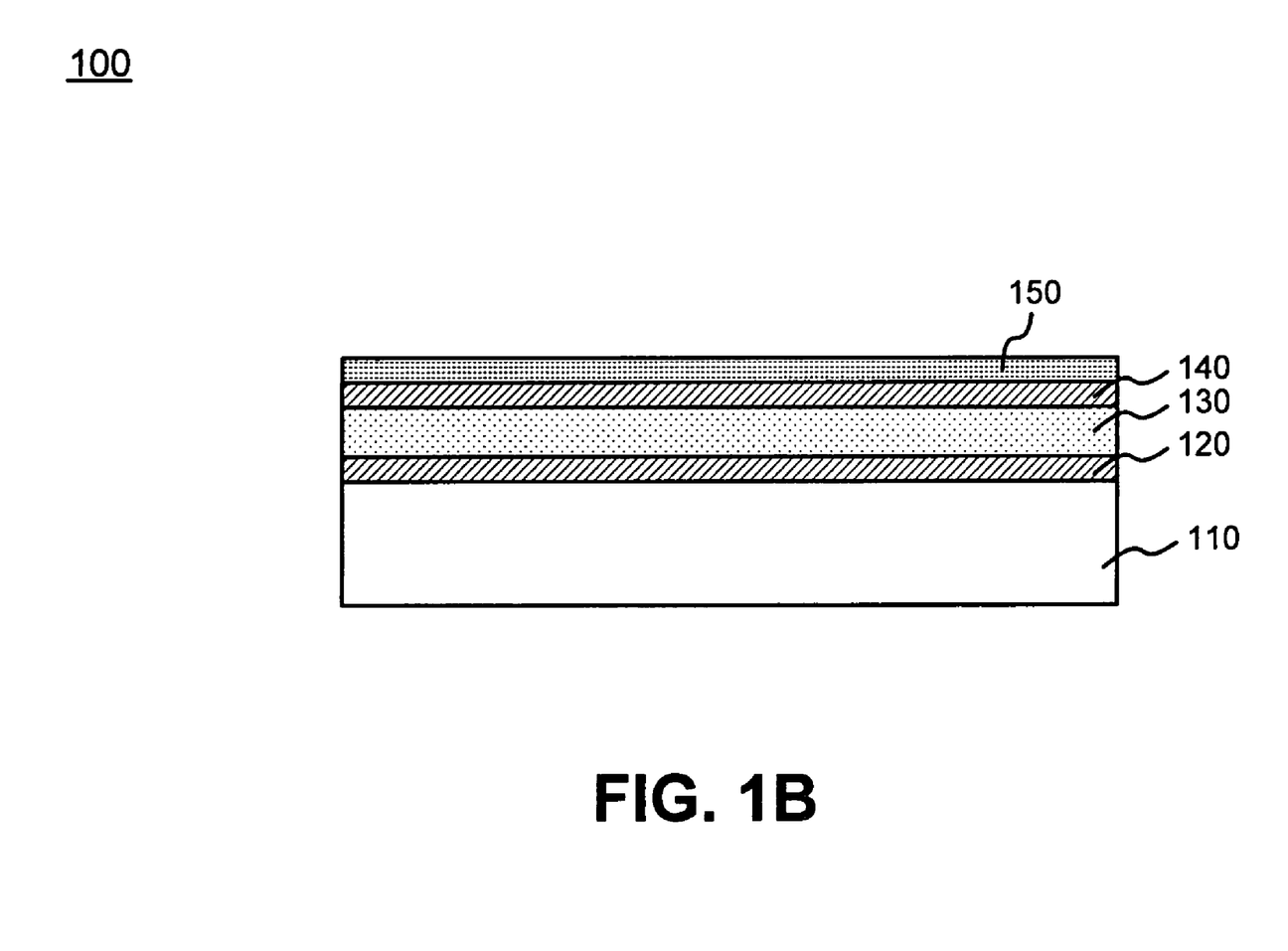
FIG. 1B is a cross-section illustrating the formation of a high K dielectric on the device of FIG. 1A in accordance with an embodiment of the invention.

A high K dielectric layer 150 may be formed on layer 140, as illustrated in FIG. 1B. In an exemplary embodiment, dielectric layer 150 may have a thickness ranging from about 30 Å to about 200 Å. Dielectric layer 150, consistent with the invention, may function as an intergate dielectric (along with layer 140). Dielectric layer 150 may also function to prevent back gate injection problems associated with erasing a memory cell, as described in more detail below.

In an exemplary embodiment, dielectric layer 150 may include an aluminum oxide (e.g., Al$_2$O$_3$), a hafnium oxide (e.g., HfO$_2$) or HfSi$_x$O$_y$ deposited using an atomic layer deposition (ALD) process or a chemical vapor deposition (CVD) process. In an exemplary embodiment, the deposition process may be performed at a relatively high temperature. For example, an aluminum oxide layer 150 may be deposited using a deposition process performed at a temperature ranging from about 300° C. to about 500° C. It has been found that depositing aluminum oxide layer 150 using a higher temperature deposition process, e.g., greater than about 300° C., than that conventionally used to deposit aluminum oxide reduces the erase times for the memory cells of semiconductor device 100, as described in more detail below. In addition, aluminum oxide layer 150 reduces or eliminates back gate injection problems associated with FN erasing.

Figure 1C:
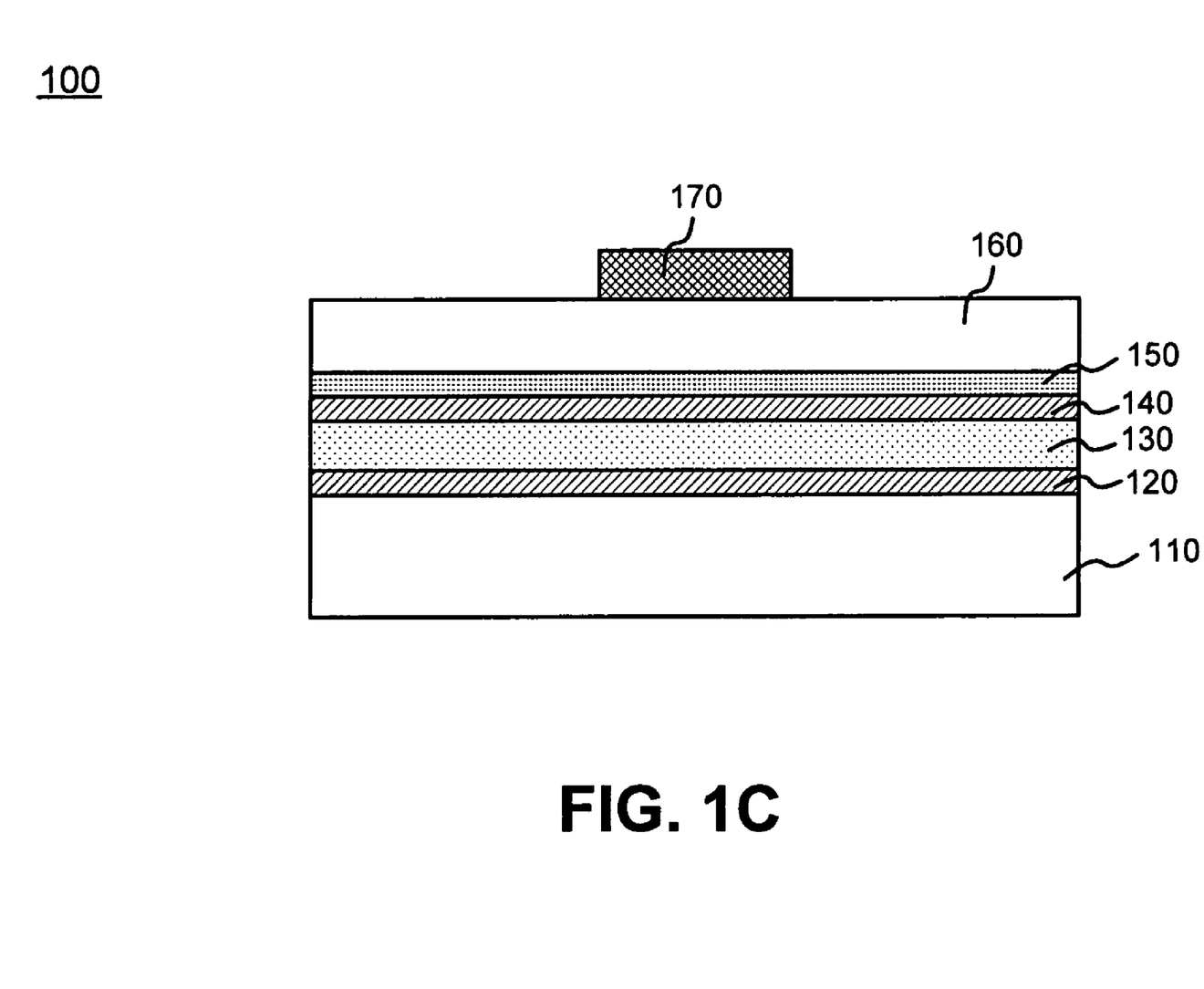
FIG. 1C is a cross-section illustrating the formation of control gate layer on the device of FIG. 1B in accordance with an embodiment of the invention.

A conductive layer 160, such as polycrystalline silicon, may be formed on dielectric layer 150, as illustrated in FIG. 1C. Alternatively, conductive layer 160 may include other semiconducting materials, such as germanium or silicon-germanium, or various metals, such as titanium or tungsten. In an exemplary implementation, conductive layer 160 may have a thickness ranging from about 500 Å to about 2000 Å. Conductive layer 160, consistent with the invention, may be used to form one or more control gate electrodes for one or more memory cells in semiconductor device 100. An optional silicide layer, such as titanium silicide (not shown) may be formed on conductive layer 160.

A photoresist material may be patterned and etched to form mask 170 on the top surface of conductive layer 160, as illustrated in FIG. 1C. Mask 170 may be used to facilitate formation of one or memory cells in semiconductor device 100, as described in more detail below.

Figure 2:
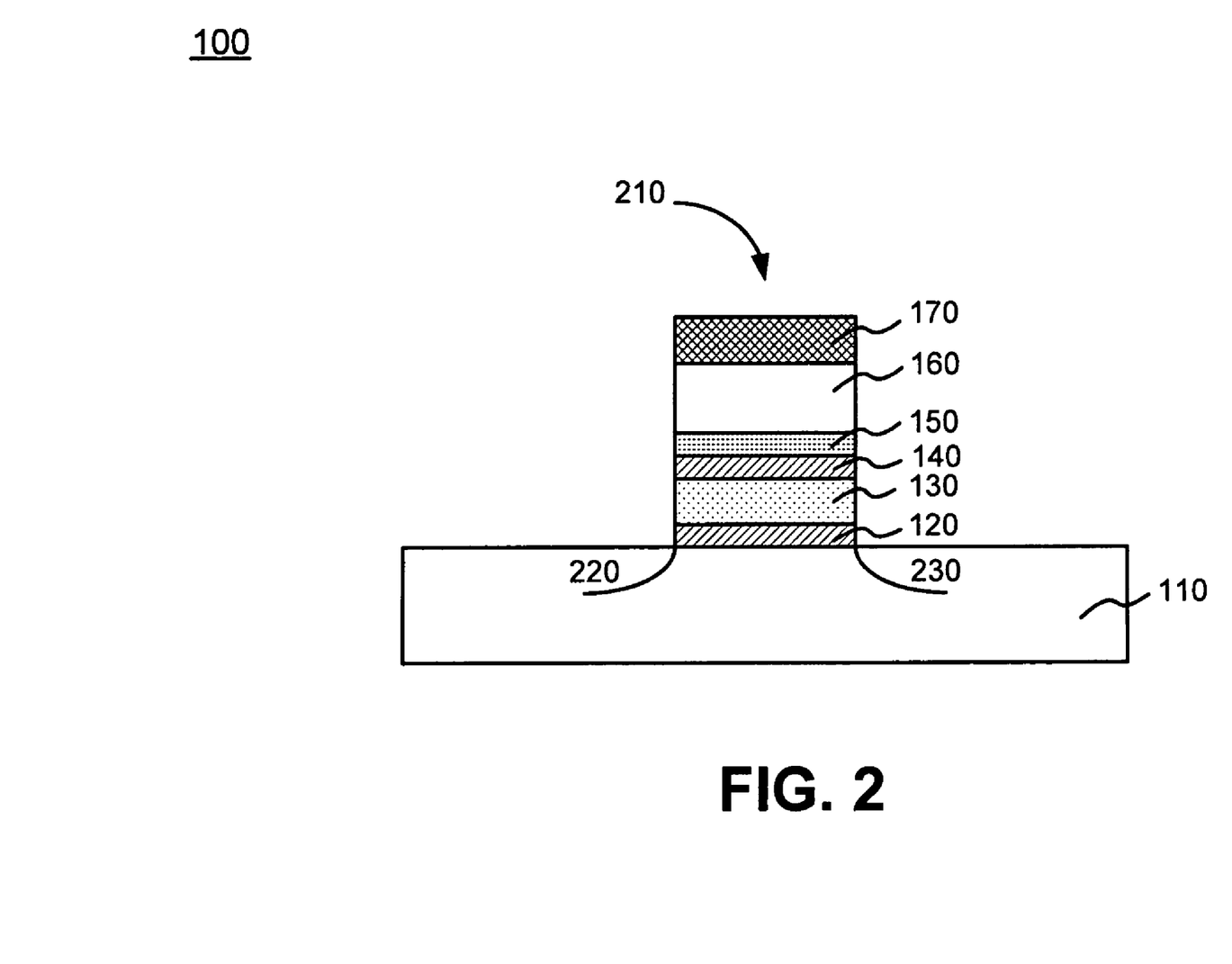
FIG. 2 is a cross-section illustrating the formation of a memory cell in accordance with an embodiment of the invention.

Semiconductor device 100 may then be etched, as illustrated in FIG. 2. Referring to FIG. 2, layers 120-160 may be etched in a conventional manner with the etching terminating at substrate 110, thereby forming structure 210. Structure 210 (also referred to herein as a memory cell 210) may represent a memory cell of semiconductor device 100, where the memory cell 210 includes a dielectric layer 120, a charge storage layer 130, an inter-gate dielectric layer 140, a high K dielectric layer 150 and a control gate electrode 160. Only one memory cell 210 is illustrated in semiconductor device 100 in FIG. 2 for simplicity. It should be understood that semiconductor device 100 may typically include a memory array including a large number of memory cells 210.

In an exemplary implementation consistent with the invention, each memory cell 210 includes an aluminum-oxide-nitride-oxide (AONO) structure. That is, each memory cell 210 may include an aluminum oxide layer 150 formed on an oxide-nitride-oxide (ONO) stack (i.e., layers 140, 130 and 120), with nitride layer 130 acting as a charge storage layer. The AONO stack may be formed on substrate 110 and a control gate electrode 160 may be formed over the AONO stack.

Source and drain regions 220 and 230 may then be formed in substrate 110, as illustrated in FIG. 2. For example, n-type impurities, such as phosphorous or arsenic may be implanted in substrate 110 to form source and drain regions 220 and 230, based on the particular end device requirements. Alternatively, a p-type dopant, such as boron, may be implanted in substrate 110 to form source and drain regions 220 and 230. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
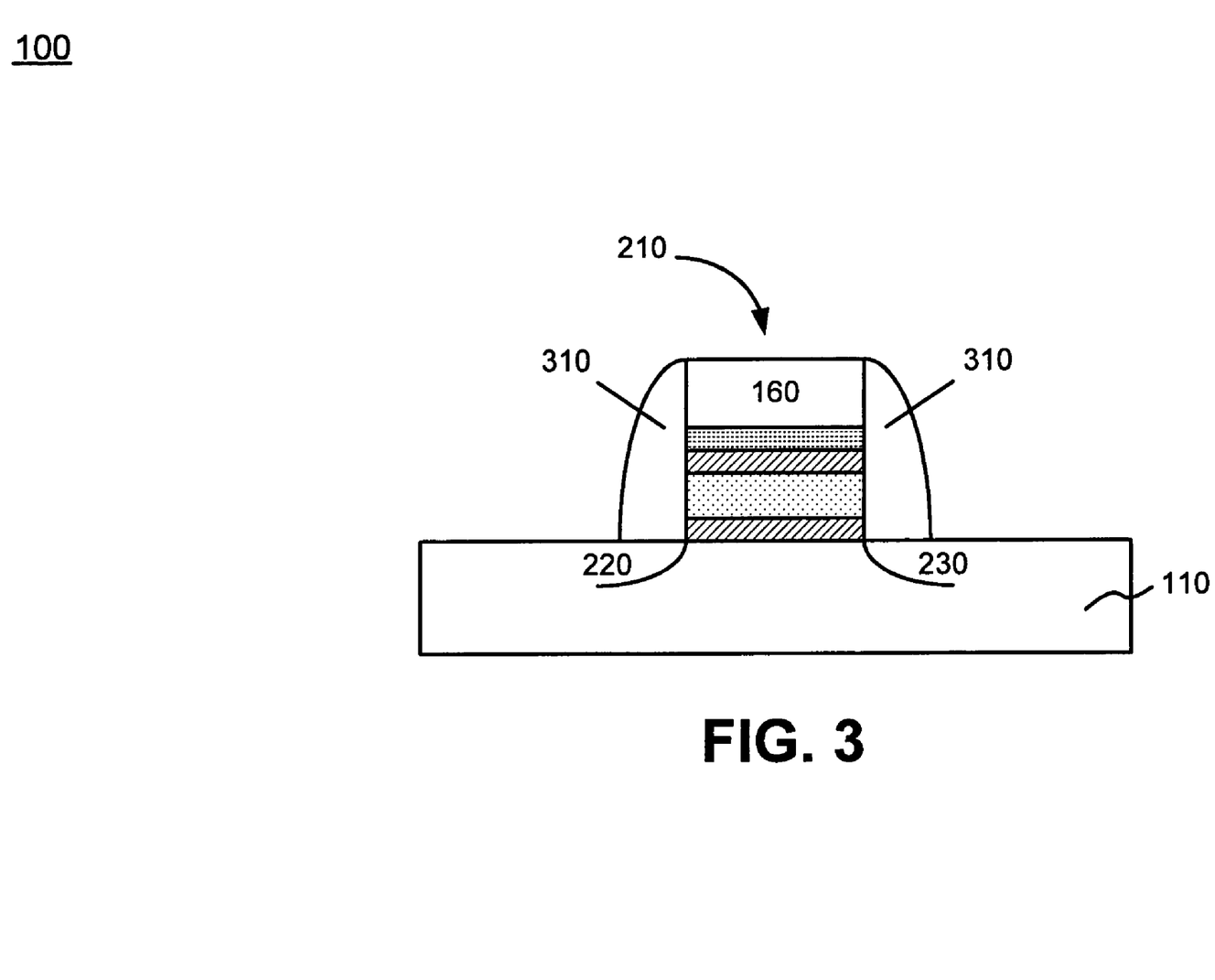
FIG. 3 is a cross-section illustrating the formation of spacers and source and drain regions for the device of FIG. 2 in accordance with an embodiment of the invention.

Photoresist mask 170 may then be removed using a conventional process. Spacers 310 may then be formed adjacent the sidewalls of the memory cells 210, as illustrated in FIG. 3. For example, a dielectric material, such as a silicon oxide, a silicon oxynitride or another dielectric material, may be deposited and etched to form spacers 310 on each side of memory cell 210, as illustrated in FIG. 3. Spacers 310 may be used to electrically isolate memory cell 210 from adjacent memory cells (not shown). Spacers 310 may also be used to facilitate the deposition of impurities in semiconductor device 100.

Figure 4:
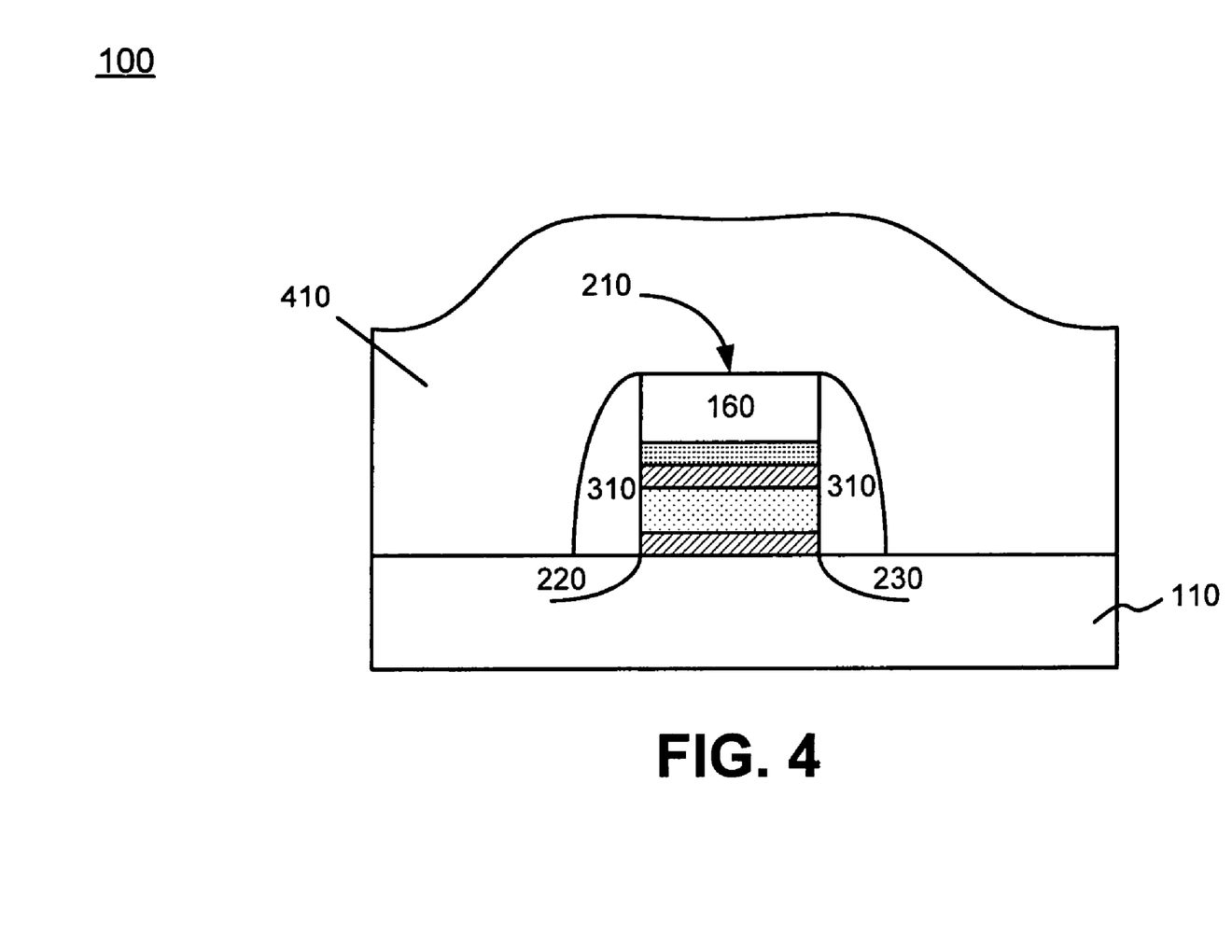
FIG. 4 is a cross-section illustrating the formation of an interlayer dielectric on the device of FIG. 3 in accordance with an embodiment of the invention.

A dielectric layer 410 may then be deposited over semiconductor device 100, as illustrated in FIG. 4. Dielectric layer 410 (also referred to as interlayer dielectric (ILD) 410) may include, for example, a phosphosilicate glass (PSG) material, a boro-phosphosilicate (BSPG) material, an oxide or some other dielectric material.

Figure 5:
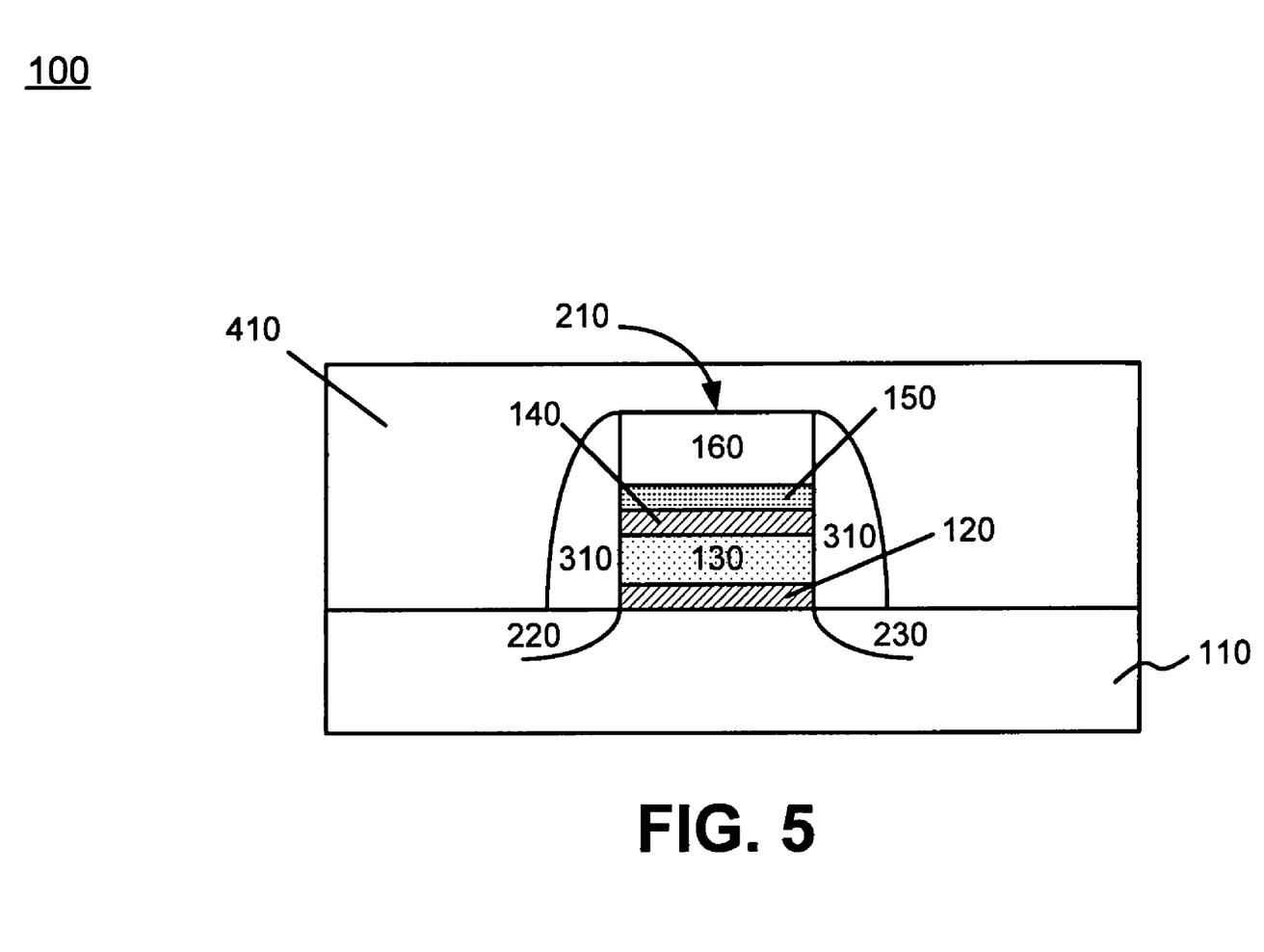
FIG. 5 is a cross-section illustrating the planarization of the interlayer dielectric of FIG. 4 in accordance with an embodiment of the invention.

ILD 410 may optionally be planarized using a conventional process, such as a chemical-mechanical polishing (CMP)

process, as illustrated in FIG. 5. Referring to FIG. 5, the CMP process may planarize the top surface of ILD 410 to facilitate formation of subsequent structures, such as interconnect lines. ILD 410 functions to isolate various conductive structures, such as various interconnect lines (not shown), source region 220 or drain region 230 from an external electrode (not shown), etc.

For example, a trench (not shown) may subsequently be formed in ILD 410 using conventional photolithographic and etching technique. The trench may be used to form a contact to, for example, source region 220 or drain region 230. Next, a metal layer, such as copper or aluminum, may be deposited to fill the trench.

An interconnect line may then be formed over the planarized top surface of ILD 410 in FIG. 5. For example, a metal, such as copper or aluminum, may be deposited to form an interconnect that connects various features in semiconductor device 100, such as source or drain regions 220/230 to an external electrode, to facilitate programming or erasing various memory cells 210 in semiconductor device 100.

As described above, in an exemplary embodiment, the resulting semiconductor device 100 illustrated in FIG. 5 includes a control gate electrode 160 formed on an AONO structure (i.e., layers 150, 140, 130 and 120). In this embodiment, high K dielectric layer 150 comprises an aluminum oxide that is deposited at a temperature that results in faster erase times when erasing memory cell 210 of semiconductor device 100.

Memory cell 210 may be an EEPROM type memory device and one or more programming circuits (not shown) may be used to facilitate programming and erasing of one or more memory cells 210 of semiconductor device 100. Programming of memory cell 210 may be accomplished by applying a voltage of, for example, about 5 volts to 20 volts to control gate 160. Once programmed, electrons remain trapped in nitride layer 130 until an erase procedure is performed.

In an exemplary embodiment, erasing of memory cell 100 may be accomplished by an FN tunneling procedure. For example, erasing of memory cell may be performed by applying a bias of about 5 volts to about 20 volts to control gate electrode 160. In addition, a bias of, for example, about 5 volts to about 20 volts may be applied to source region 220 or drain region 230. During erasing, electrons may tunnel from nitride layer 130 into substrate 110 (e.g., source or drain regions 220/230) via oxide layer 120. Advantageously, aluminum oxide layer 150 prevents or substantially reduces the number of electrons from control gate electrode 160 that may tunnel into nitride layer 130 during the FN erase procedure. In addition, it has been found that depositing aluminum oxide layer 150 using a relatively high deposition process (i.e., greater than 300° C., such as 325° C. or higher) results in faster FN erase times as compared to an aluminum oxide layer 150 deposited at a lower temperature.

For example, it has been found that increasing the temperature associated with the deposition of aluminum oxide layer 150 from about 275° C. to about 325° C. decreases the erase time for a memory cell 210 in semiconductor device by about 50 percent.

In summary, implementations consistent with the invention use a high K dielectric layer to allow a SONOS type memory device to be erased using an FN tunneling type erase procedure. In addition, depositing the high K dielectric at a relatively high temperature has been found to reduce FN erase times for the memory cells 210 of semiconductor device 100.

The description above focuses on a semiconductor memory device 100, such as an EEPROM, that stores one bit of data per memory cell 210. In other implementations, each of memory cells 210 illustrated in FIG. 5 may be configured to store two bits of data. That is, charge storage layer 130 may be programmed to store two separate bits of data by localizing the first and second charges to the respective left and right sides of charge storage layer 130 illustrated in FIG. 5. Each of the two bits of memory cell 210 may be programmed independently by, for example, channel hot electron injection, to store a bit on each respective side of the charge storage layer 130. In this manner, the charges in charge storage layer 130 become effectively trapped on each respective side of charge storage layer 130. Erasing of each bit in memory cell 210 may also be performed independently. During FN erasing, the bits stored in charge storage layer 130 may tunnel through dielectric layer 120 into the source region 220 and drain region 230, respectively.

In this manner, the density of the resulting memory array in semiconductor device 100 may be increased as compared to conventional memory devices that store only one bit of data per cell.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of manufacturing a semiconductor device, comprising:

forming a first dielectric layer over a substrate;

forming a dielectric charge storage element directly on the first dielectric layer;

forming a second dielectric layer directly on the dielectric charge storage element;

depositing aluminum oxide at a temperature greater than 325° C. and directly on the second dielectric layer, where depositing the aluminum oxide includes depositing an aluminum oxide layer having a thickness ranging from about 30 Å to about 200 Å; and forming a control gate over the aluminum oxide.

2. The method of claim 1, where the dielectric charge storage element comprises a nitride.

3. The method of claim 1, where depositing the aluminum oxide at a temperature greater than 325° C. comprises:

depositing aluminum oxide at a temperature ranging from greater than 400° C. to about 500° C.

4. The method of claim 1, where depositing the aluminum oxide comprises:

depositing the aluminum oxide using an atomic layer deposition process.

5. The method of claim 1, where forming the dielectric charge storage element comprises:

forming a nitride layer having a thickness ranging from about 20 Å to about 100 Å.

6. The method of claim 5, where forming the second dielectric layer comprises:

Forming a silicon oxide layer having a thickness ranging from about 15 Å to 100 Å.

7. The method of claim 1, where depositing the aluminum oxide further includes depositing hafnium.

8. The method of claim 1, further comprising:

forming a plurality of memory cells in the semiconductor device, where each of the memory cells stores charges representing two bits of information.

* * * * *